United States Patent [19]

Todd et al.

[11] Patent Number: 4,700,361
[45] Date of Patent: Oct. 13, 1987

[54] SPECTRAL EMPHASIS AND DE-EMPHASIS
[75] Inventors: Craig C. Todd, Muir Beach; Kenneth J. Gundry, San Francisco, both of Calif.
[73] Assignee: Dolby Laboratories Licensing Corporation, San Francisco, Calif.
[21] Appl. No.: 642,044
[22] Filed: Aug. 21, 1984

Related U.S. Application Data

[63] Continuation-in-part of Ser. No. 540,195, Oct. 7, 1983, abandoned, and a continuation-in-part of Ser. No. 540,421, Oct. 7, 1983, abandoned.
[51] Int. Cl.$^4$ .............................................. H04B 14/04
[52] U.S. Cl. ........................................ 375/25; 333/14; 381/31; 381/94; 381/101
[58] Field of Search .................. 375/25, 26, 34, 51, 375/57, 58, 103, 122, 60; 381/29, 31, 94, 98, 101, 102, 106, 107; 360/25, 32; 333/14, 17 R, 17 L; 328/163, 167; 364/724

[56] References Cited

U.S. PATENT DOCUMENTS

| | | | |
|---|---|---|---|
| 2,621,251 | 12/1952 | Aigrain | 375/34 |
| 3,249,870 | 5/1966 | Greefkes | 375/34 |
| 3,471,648 | 10/1969 | Miller . | |
| 3,483,328 | 12/1969 | Stewart . | |
| 3,518,548 | 6/1970 | Greefkes | 375/26 |
| 3,518,566 | 6/1970 | Vogel . | |
| 3,518,578 | 6/1970 | Oppenheim et al. | 333/14 |
| 3,535,550 | 10/1970 | Kang | 333/14 |
| 3,657,489 | 4/1972 | Clark et al. | 333/14 |
| 3,808,540 | 4/1974 | Kabrick | 381/107 |
| 3,823,376 | 7/1974 | Greefkes et al. | 375/26 |
| 3,934,190 | 1/1976 | Dolby | 381/106 |
| 4,038,539 | 7/1977 | Van Cleave | 333/28 R |
| 4,072,914 | 2/1978 | Haramoto et al. | 333/14 |
| 4,085,368 | 4/1978 | Yeh | 375/101 |
| 4,101,849 | 7/1978 | Blackmer et al. . | |
| 4,169,219 | 9/1979 | Beard . | |
| 4,198,650 | 4/1980 | Hongu et al. . | |
| 4,224,581 | 9/1980 | Watanabe et al. | 333/14 |
| 4,507,791 | 3/1985 | Gundru | 381/101 |
| 4,509,037 | 4/1985 | Harris | 375/28 |
| 4,538,297 | 8/1985 | Waller, Jr. | 333/14 |

FOREIGN PATENT DOCUMENTS 54-57905 5/1979 Japan .
1108413 3/1968 United Kingdom .
1520264 2/1978 United Kingdom .
1508687 4/1978 United Kingdom .
2041704 10/1980 United Kingdom .
1589162 7/1981 United Kingdom .
2083988 3/1982 United Kingdom .

OTHER PUBLICATIONS

Bellanger, "Dental Filtering by Polyhase Network": IEEE Transaction on Acoustics and Signal Processing, vol. ASPS, No. 2, Apr. 76.

Primary Examiner—Robert L. Griffin
Assistant Examiner—Stephen Chin
Attorney, Agent, or Firm—Majestic, Gallagher, Parsons & Siebert

[57] ABSTRACT

The complementary pre-processing and post-processing circuits of this invention are advantageous for reducing noise introduced into a signal by a process or medium where the noise introduced rises with the signal level. The pre-processing circuit analyzes the spectral composition of an input signal and generates an emphasis control signal to so indicate. The emphasis control signal is limited by a limitation circuit to a desired bandwidth. The pre-processing circuit includes an emphasis applying circuit for amplifying or attenuating the input signal as a function of the emphasis control signal. A delay circuit delays the input signal relative to the emphasis control signal so that the input signal reaches the emphasis applying circuit when the emphasis control signal is available for controlling the amplification or attenuation applied.

The post-processing circuit restores the spectral composition of the signal. The post-processing circuit comprises a circuit for deriving a de-emphasis control signal of limited bandwidth from the emphasis control signal. A de-emphasis applying circuit attenuates or amplifies the decoded signal as a function of the de-emphasis control signal to restore its spectral composition., Since the noise introduced by the process or medium is a function of the signal level, the pre-processing circuit alters the input signal in such manner that the noise introduced is reduced. The emphasis and de-emphasis applied in pre- and post-processing change slowly and the system is tolerant of component and timing errors.

43 Claims, 8 Drawing Figures

SPECTRAL EMPHASIS AND DE-EMPHASIS

CROSS REFERENCE TO RELATED APPLICATIONS

This application is a continuation-in-part application of two parent applications Ser. No. 540,195 entitled "A-D Encoder and D-A Decoder System" and Ser. No. 540,421 entitled "Spectral Emphasis and De-emphasis", both filed Oct. 7, 1983 by Kenneth James Gundry and Craig C. Todd. This application is also related to another application filed herewith and referred to below as the companion application: "A-D Encoder and D-A Decoder System" by Craig C. Todd and Kenneth James Gundry, which is a continuation-in-part application also of the two parent applications referenced above and filed on Oct. 7, 1983 now abandoned. This application is also related to an application entitled "Analog and Digital Signal Apparatus" by Kenneth James Gundry, filed Sept. 7, 1982, Ser. No. 415,028 now abandoned.

BACKGROUND OF THE INVENTION

This invention relates in general to emphasis and de-emphasis circuits and in particular to circuits which reduce noise by altering the spectral content of the signal.

In many adaptive A-D and D-A coding systems the step-size used increases with the level of the input signal. Since quantizing noise increases with the step-size the quantizing noise of such adaptive systems increases with the input signal level, an effect known as noise modulation. The effects of noise modulation is disturbing in many applications, such as in high quality audio.

It is a characteristic of human hearing that spurious spectral information is much less audible if it is close in frequency to the desired audio signal. If the spurious energy lies far from the desired audio signal frequency it is much more likely to be audible. Thus where the noise level is a function of the input signal level it is particularly important to reduce noise whose frequencies are far from the desired audio signal.

Conventional noise reduction systems have been used to apply adaptive emphasis and de-emphasis to reduce audible noise. One conventional system employs fixed emphasis for boosting high frequency signals and complementary de-emphasis for bucking such signals. When such emphasis and de-emphasis are used to reduce audible noise that increases with signal level and when the predominant signals are of high frequencies, low frequency noise will instead be increased. Fixed high frequency emphasis and de-emphasis are therefore unsatisfactory for reducing such noise.

A well known type of circuit, called "sliding band", reduces audible high frequency noise by way of a filter with a variable corner frequency. As the level of high frequency signals increases, the filter corner frequency slides upwardly to narrow the band boosted and cut. Examples of such circuits are to be found in U.S. Pat. Nos. Re. 28,426, 4,072,914 and 3,934,190.

The sliding of the filter corner frequency depends on both the amplitude and frequency of the input signal. If such a "sliding band" type circuit is used to reduce audible noise that is a function of input signal level, low frequency noise may also be increased when the predominant spectral components of the input signal are at very high frequencies. While such a problem is not as serious as in the case of the high frequency fixed emphasis and de-emphasis, the "sliding band" type circuit is not entirely satisfactory for reducing noise which increases with signal level.

SUMMARY OF THE INVENTION

The invention is based on the observation that in order to reduce noise whose level is a function of the input signal level, the different spectral components of the input signal may be altered depending on the spectral composition of the input signal by subjecting the input signal to emphasis and subsequent de-emphasis in a complementary manner to recover an output signal which is substantially similar to the input signal. The spectral emphasis and de-emphasis circuits of this invention are particularly advantageous for reducing audible quantizing noise in many adaptive A-D and D-A coding systems.

The apparatus of this invention comprises a circuit for altering the spectral composition of an input signal and a circuit for restoring the spectral composition of the signal. The circuit for altering the spectral composition of the input signal comprises means for analyzing the relative spectral composition of the input signal and for identifying the regions in the frequency spectrum, if any, where the predominant components of the input signal are concentrated. The analyzing means generates an emphasis control signal of limited bandwidth to indicate the spectral composition and such regions. The circuit further comprises means responsive to the emphasis control signal for altering the spectral composition of the input signal to generate an output signal by applying to the spectral components, emphasis of varying amounts as a function of the emphasis control signal.

The circuit for restoring the spectral composition of the input signal receives from the spectral composition altering circuit an altered signal and spectral information of the signal through a transmission medium to restore the spectral composition of the signal. The restoring means comprises means for generating from the spectral information a de-emphasis control signal for restoring the spectral composition of the signal by applying de-emphasis to the spectral components of the altered signal as a function of the de-emphasis control signal. The de-emphasis applied by the restoring means is substantially complementary to the emphasis applied by the spectral composition altering circuit.

In one embodiment of the restoring circuit, the de-emphasis control signal is limited in bandwidth before it is used to control the de-emphasis applied to reduce noise caused by transmission errors. In a second embodiment, the spectral information is received by the restoring circuit in advance of the altered signal by a predetermined and substantially fixed time interval. Such time interval permits bandwidth limitation of the de-emphasis control signal in the restoring circuit by compensating for the time delay caused by such bandwidth limitation, so that the bandwidth limited de-emphasis control signal reaches the de-emphasis applying means at substantially the same time as the altered signal.

Another aspect of the invention is directed to a particular emphasis and complementary de-emphasis which, when applied to a medium whose noise level is a function of the signal level in the medium, reduces noise introduced by the medium. In such aspect, an emphasis control signal is generated to indicate the spectrum of the input signal and the regions in the frequency spectrum, if any, where predominant components of the input signal are concentrated. The altering circuit comprises means responsive to the emphasis control signal for applying emphasis to the spectral components by boosting the components with frequencies above a variable frequency while bucking or leaving substantially unchanged the components with frequencies below such variable frequency. Such variable frequency is a characteristic of the emphasis applying means; it slides substantially continuously upwards in frequency when the predominant signal components of the input signal rise in frequency so that it is above the frequencies of the predominant signal components.

The restoring circuit has characteristics which are substantially complementary to those of the altering circuit. Such characteristics of the altering and restoring circuits are particularly advantageous for reducing noise which increases with signal level as well as signal frequency.

DETAILED DESCRIPTION OF THE PREFERRED EMBODIMENT

Figure 2A:
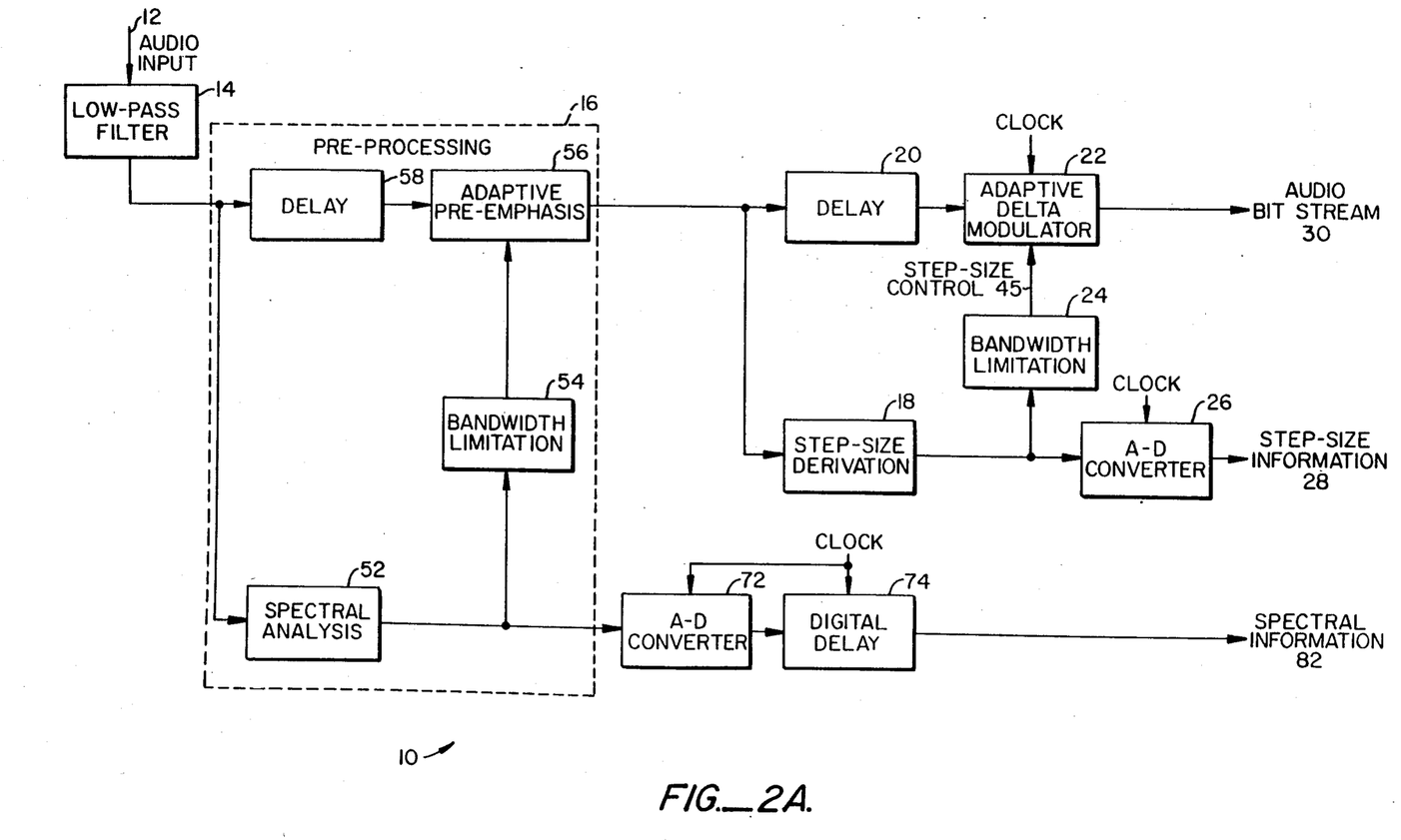
FIG. 2A is a block diagram of an encoder which includes a pre-processing circuit illustrating an embodiment of this invention.
Figure 2B:
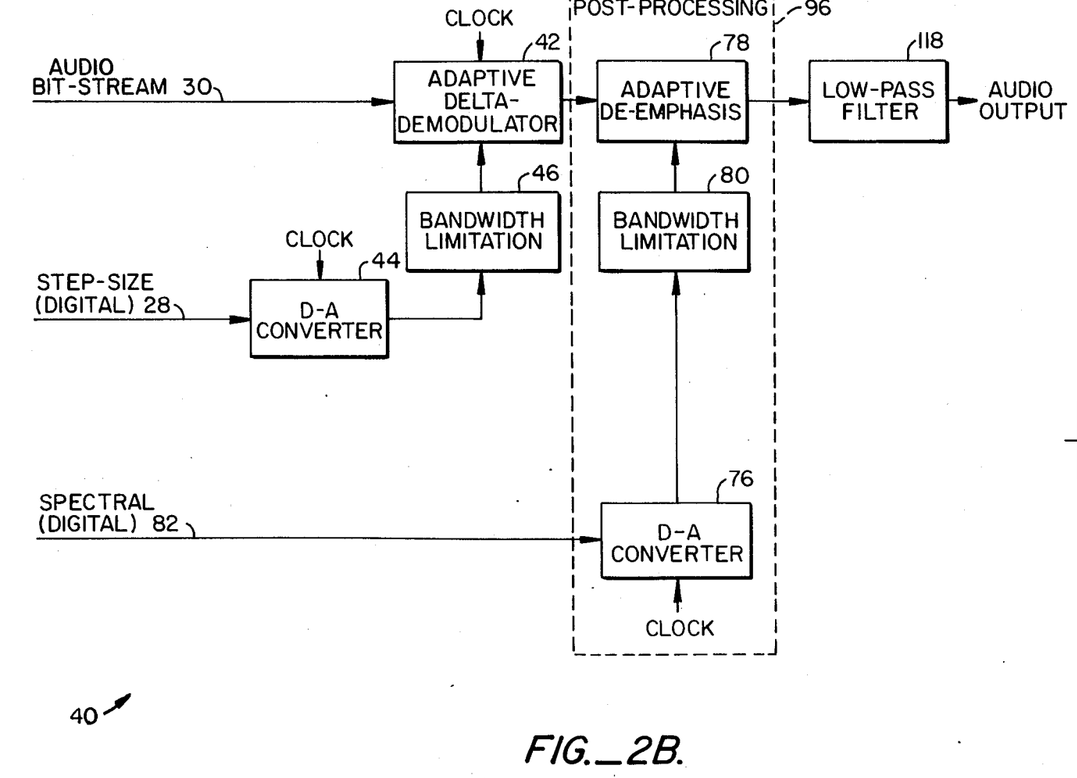
FIG. 2B. is a block diagram of a decoder which includes a post-processing circuit illustrating the preferred embodiment of this invention.

The spectral composition altering and restoration circuits of this invention are particularly suitable for reducing noise which is a function of signal level. Below is a description of an A-D and D-A conversion system whose noise level rises with the signal level; the description will serve as a background desirable for understanding this invention. FIGS. 2A and 2B are block diagrams for an adaptive A-D encoder and D-A decoder system which includes a pre-processing circuit and a post-processing circuit for altering and restoring the spectral composition of signals to illustrate this invention. The derivation, transmission and processing of step-size information in the encoder-decoder system is the subject of the companion application. The discussion that immediately follows concerning step-size determination is taken from such companion application.

The noise and distortion emerging from an ADM encoder-decoder system (codec) depend on the audio input signal and the step-size, both of which are varying. Consider a codec handling a single sine wave. As a function of step-size, the output noise and distortion will vary as shown qualitatively in FIG. 1. In the region labelled A, the step-size is too large, which produces excessive quantizing noise. In region B the step-size is too small and the system is in overload which produces high noise and distortion. There is an optimum value of step-size for the particular input condition labelled C. For each short time segment of real audio there is a curve like that of FIG. 1, and an optimum step-size. In a conventional output controlled ADM system the step-size rarely achieves the optimum value, but remains in region A most of the time, moving into region B on signal transients. The object of this invention is to design an ADM system that operates as much as possible in region C, and that operates so that the delta modulator is fully loaded. This is possible because the step-size determination is done in the encoder and is input controlled as explained below.

FIG. 2A is a block diagram for an encoder illustrating an embodiment of this invention. As shown in FIG. 2A, an analog audio input signal 12 is passed through a low-pass filter 14 to determine the overall audio bandwidth of the analog input signal. Typically such bandwidth may be 15 kHz. The analog input signal is then passed through a pre-processing circuit 16. The function of the pre-processing circuit 16 will be discussed below.

After being pre-processed the analog audio input signal is supplied to a step-size derivation circuit 18 and to a delay circuit 20. In one particular application the step-size derivation circuit 18 comprises a slope detector for detecting the time derivative or slope of the incoming audio input signal. The slope detector then generates a control signal indicative of the step-size to be used in the adaptive delta modulator 22. The control signal is limited by a bandwidth limitation circuit 24 and then applied to the adaptive delta modulator 22. A-D converter 26 converts the step-size control signal into a bit-stream of digital signals to convey step-size information. After being time delayed by delay circuit 20 the audio input signal is converted into a bit-stream of digital audio signals by adaptive delta modulator 22 in accordance with the step-size indicated by the bandwidth limited step-size control signal 45. The audio bit-stream and the step-size information bit-stream are then transmitted through a medium to a decoder which is shown in FIG. 2B. In one particular application encoder 10 is part of a broadcasting station transmitting the audio and step-size information bit-streams to decoders in consumer systems. The function of delay circuit 20 and bandwidth limitation circuit 24 will be discussed after a brief description of the decoder of FIG. 2B below.

FIG. 2B is a block diagram of a decoder illustrating the preferred embodiment of this invention. As shown in FIG. 2B decoder 40 comprises an adaptive delta demodulator 42 for receiving the digital audio bit-stream 30 transmitted through the medium and a D-A converter 44 for receiving the digital step-size information bit-stream 28. D-A converter 44 converts the digital bit-stream into an analog step-size control signal which is supplied to bandwidth limitation circuit 46. After being limited in bandwidth, the step-size control signal is applied to adaptive delta demodulator 42. Adaptive delta demodulator 42 generates an analog audio output signal from the audio bit-stream in accordance with bandwidth limited step-size control signal from bandwidth limitation 46. Bandwidth limitation circuit 24 of FIG. 2A limits the bandwidth of the step-size control signal applied to adaptive delta-modulator 22 so that the step-size cannot change abruptly from one sample to the next. Similarly, bandwidth limitation circuit 46 limits the bandwidth of the step-size control signal applied to adaptive delta-demodulator 42. Thus if the transmission medium introduces a bit error in the step-size information bit-stream, such an error, after being converted into analog form by D-A converter 44, cannot introduce a major error in the step-size at adaptive delta demodulator 42. The effect of transmission errors is thereby reduced. Therefore, cheap non-precision components may be used to construct the converters 26, 44 and the transmission of the step-size information bit-stream is highly tolerant of bit errors.

The generation of a limited bandwidth step-size control signal will require a finite time. To compensate for such time, delay circuit 20 introduces a time delay so that the pre-processed analog audio input signal will reach adaptive delta modulator 22 at a time when the step-size control signal for such input signal is available from bandwidth limitation circuit 24. This is particularly advantageous when there are sudden changes in the slope of the input audio signal.

While in FIGS. 2A and 2B the step-size information bit-stream 28 and audio bit-stream 30 are shown as being transmitted separately, it will be understood that the two bit-streams may be transmitted together in one single channel provided that the two bit-streams can be distinguished from each other. Similarly, all three bit-streams 28, 30 and 82 may also be transmitted in the same channel instead of in separate channels if they can be distinguished from each other.

By introducing a time delay through delay circuit 20 that also compensates for the time delay caused by the bandwidth limitation circuit 46 in the decoder, the audio bit-stream signals which are the digital representation of a particular analog signal reach the delta demodulator when the bandwidth limited step-size control signal is available from circuit 46. In such manner, the need for a delay circuit in the decoder to compensate for the time delay caused by the bandwidth limiting of the step-size control signal in the decoder is eliminated and the decoder circuit is simplified. This is particularly advantageous for lowering the cost of consumer decoder equipment.

The invention of this application will now be discussed. The pre-processing and post-processing circuits 16, 96 and other associated circuit components illustrate this invention. Since the step-size in the A-D and D-A conversions is variable, the noise amplitude will be modulated depending on the step-size and such noise modulation is undesirable in many applications such as in high quality audio equipment. Noise modulation is reduced by pre-processing circuit 16 and post-processing circuit 96 when combined with components A-D converter 72 and digital delay 74 of FIG. 2A. The pre-processing circuit 16 comprises spectral analysis circuit 52, bandwidth limitation circuit 54, adaptive pre-emphasis circuit 56, and delay circuit 58, all of FIG. 2A. The post-processing circuit 96 comprises D-A converter 76, adaptive de-emphasis circuit 78 and bandwidth limitation circuit 80, all of FIG. 2B.

Spectral analysis circuit 52 analyzes the audio input signal to generate an emphasis control signal. The emphasis control signal generated is a function only of the spectrum of the input audio and is substantially independent of the amplitude of the input audio. The emphasis control signal is then limited by bandwidth limitation circuit 54 and applied to adaptive pre-emphasis circuit 56. Adaptive pre-emphasis circuit 56 boosts or boosts and bucks the different frequency components of the input audio signal by amounts which are functions of the emphasis control signal. The emphasis control signal is limited in bandwidth so that the frequency response of the adaptive pre-emphasis circuit 56 will not change suddenly from sample to sample. Bandwidth limitation circuit 80 reduces the effect of bit errors introduced by the transmission medium in a manner similar to bandwidth limitation circuit 46 described above.

In reference to FIGS. 2A, 2B, delay circuit 58 introduces a time delay which permits the pre-emphasis circuit 56 to complete its adaptation before the audio input signal is supplied to the pre-emphasis circuit 56. The pre-processed audio input signal is supplied to delay circuit 20 and adaptive delta modulator 22 as described above. The emphasis control signal from spectral analysis circuit 52 is converted into a digital bit-stream carrying spectral information by A-D converter 72 and is delayed by digital delay 74 by a time period substantially equal to that of delay circuit 20.

Comparing the timing relationship of the audio and the spectral information bit-streams, an audio signal in the audio bit-stream has been delayed by delay circuits 58, 20, whereas the corresponding spectral information signal for such audio signal has been delayed by only the digital delay 74. Thus the net effect is that the audio is delayed relative to the corresponding spectral information by the time delay caused by delay 58, so that the spectral information reaches the decoder of FIG. 2B and the post-processing circuit 96 in advance of the corresponding audio signals and at the proper time to change the amplitudes of the various frequency components of the audio signal in a manner complementary to that of the adaptive pre-emphasis circuit 56. The further requirements for complementarity are discussed below. The time delay introduced in the encoder by circuit 58 compensates for the time delay caused by bandwidth limiting the spectral information in bandwidth limitation circuit 80 in the decoder.

If the audio and the corresponding spectral information were synchronous so that they reached the decoder and the post-processing circuit at the same time, the time delay caused by bandwidth limitation circuit 80 would cause the audio to reach the adaptive de-emphasis 78 before the bandwidth limited de-emphasis control signal was available for controlling the de-emphasis. A delay circuit would then be required in the decoder to delay the audio so that the audio would reach the de-emphasis 78 at the appropriate time. By introducing a timing discrepancy between the audio and the corresponding spectral information in the encoder in the manner discussed above, the need for a delay circuit in the decoder equipment is eliminated and the cost of the decoder is reduced.

One of the purposes of the encoder-decoder systm of FIGS. 2A and 2B is to transmit an analog audio signal through a medium so that the analog audio output signal recovered after the transmission is substantially the same as the input audio. To accomplish this purpose, the adaptive delta modulator 22 in the encoder of FIG. 2A and the adaptive delta demodulator 42 are substantially complementary to each other. In addition, the step-size control signals applied to the modulator 22 and demodulator 42 are substantially the same and are applied to the modulator and demodulator with substantially the same timing relationship with respect to the corresponding audio signals so that the modulation and demodulation applied are complementary. In other words, if the step-size control signal for an audio signal is applied at a time t before or after the audio signal reaches the modulator 22, the step-size control signal should reach the demodulator 42 also at substantially time t before or after the audio signal reaches the demodulator. This assures that the modulation and demodulation applied are substantially complementary. Similarly, the pre-processing and post-processing circuits are also substantially complementary to each other; the emphasis and de-emphasis control signals are substantially the same and have substantially the same timing relationship with respect to the audio for the application of pre-emphasis and de-emphasis so that the pre-emphasis and de-emphasis applied are substantially complementary.

After the above requirements for complementarity are generally met, however, the encoder-decoder system is highly tolerant of timing errors. Since the step-size, pre-emphasis and de-emphasis control signals can only change slowly in the encoder and decoder, the adaptive modulation and demodulation together with the pre-emphasis and de-emphasis applied by the encoder and decoder can only change slowly. Thus mismatch in timing relationship of the type discussed above and of the order of a few percent of the bandwidth limitation rise times will not cause the modulation and demodulation to deviate significantly from being complementary. Similarly mismatch in timing relationship of such order of magnitude will not cause the pre-emphasis and de-emphasis applied to deviate significantly from being complementary.

Figure 3A:
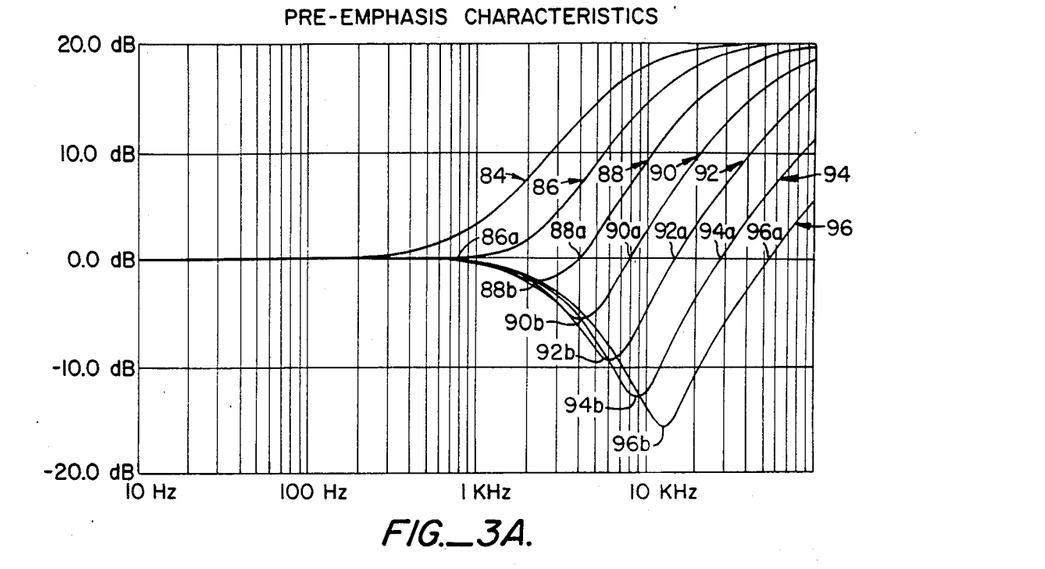
FIGS. 3A and 3B are graphical illustrations of respectively the pre-emphasis characteristics of the pre-processing circuit of FIG. 2A and the de-emphasis characteristics of the post-processing circuit of FIG. 2B.
Figure 3B:
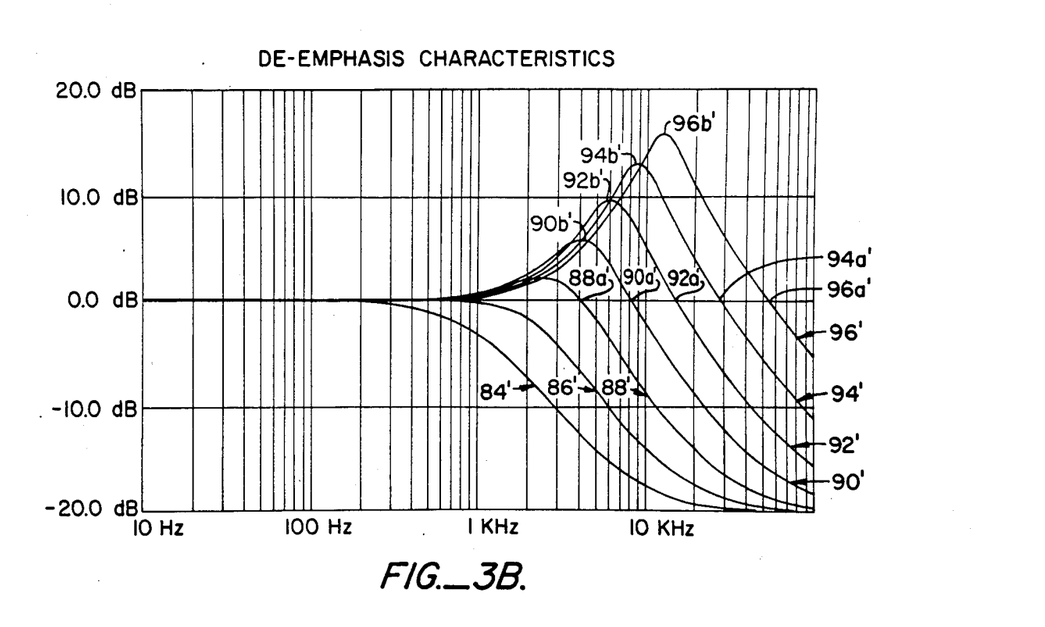

The characteristics of adaptive pre-emphasis and de-emphasis circuits 56, 78 are illustrated in FIGS. 3A, 3B. It will be understood that the specific frequencies and gains in FIGS. 3A, 3B and in the discussion below are for illustrative purposes only and that the characteristics of circuits 56, 78 are not limited thereby. In some respects, the pre-emphasis and de-emphasis characteristics are similar to the well known type of "sliding band" circuits, which reduce high frequency noise by way of a filter with a variable corner frequency. As the signal level increases, the filter corner frequencies of such "sliding band" circuits slide continuously and upwardly to narrow the band boosted and cut. Examples of such circuits are found in U.S. Pat. Nos. Re. 28,426; 4,072,914 and 3,934,190.

The pre-emphasis characteristic of circuit 56 also has a variable frequency indicated at 86a, 88a, 90a, 92a, 94a and 96a of the pre-emphasis characteristic curves 86, 88, 90, 92, 94 and 96 respectively of FIG. 3A. The de-emphasis curves 84'-96' of FIG. 3B are complementary to curves 84-96 respectively and also have variable frequencies 86a'-96a'. Such variable frequencies also continuously shift as a function of the input audio. However, unlike the "sliding band" circuits, the continuous shifting is determined, not by the level of high frequency signals but by the spectral content of the input audio in a manner described below. In the above referenced "sliding band" circuits, the signal components with frequencies higher than the variable corner frequency are boosted (or cut) and those with frequencies lower than the corner frequency remain unchanged. While signals with frequencies higher than the variable frequency are also boosted by circuit 56 as shown in FIG. 3A, for each of curves 90 through 96, there is a spectral region in which signals are bucked. Similarly there is a spectral region for each of de-emphasis curves 90'-96' in which signals are boosted. The detailed characteristics of circuit 56 are described below.

It is assumed first, for the purpose of discussion, that the predominant signal components of the input audio are concentrated in a certain region of the frequency spectrum. When the audio input signal comprises mostly low and middle frequency energy e.g. concentrated in the frequency region below 500 Hz, adaptive pre-emphasis circuit 56 adopts the response labelled 84, boosting only signals with frequencies above 500 Hz; the predominant signals with frequencies below 500 Hz remain substantially unchanged. When the audio signal from the adaptive delta-demodulator 42 reaches adaptive de-emphasis circuit 78 the high frequency components of the quantizing noise will be reduced by adaptive de-emphasis circuit 78 which will have a characteristic 84' complementary to curve 84 as shown in FIGS. 3A and 3B. High frequency noise above 500 Hz is thereby reduced sufficiently that audible noise modulation becomes much diminished. Low and medium frequency noise below 500 Hz is masked by the signal.

As the frequency of the input audio signal rises so that the predominant signal components are concentrated between about 500 Hz and 2 kHz, the emphasis control signal from the spectral analysis circuit 52 causes the frequency response of adaptive pre-emphasis circuit 56 to slide from 84 to 86 or 88. Such dynamic action of the adaptive pre-emphasis circuit prevents undesirable increases in the step-size of the adaptive delta-modulator but still allows the subsequent complementary de-emphasis to reduce noise at frequencies above those of the input signal. Low frequency noise is not yet an audible problem.

The frequency responses of the shape 84, 86, 88 (that is, sliding high frequency boost) are satisfactory for noise reduction when the predominant spectral components of the input audio signal are below 2 or 3 kHz. Noise at frequencies above these predominant spectral components is reduced as described above; lower frequency noise is masked by the signal. When the predominant spectral components of the input audio signal are at high frequencies (e.g. above 3 kHz) such sliding boost responses may no longer be satisfactory for noise reduction, since low and medium frequency noise is no longer masked by the signal. Under these signal conditions the effect of high frequency boost would be to increase the step-size employed in the adaptive delta modulator 22 and demodulator 42, resulting in an increase in wide-band quantizing noise. The subsequent complementary high frequency cut would not reduce the low frequency part of this increased noise. Thus low frequency noise would be modulated by changes in the high frequency components of the input audio signal. Under such conditions, it is desirable to convert the high frequency boost of adaptive pre-emphasis circuit 56 for the spectral region where the predominant signal components of the input audio are concentrated into a cut such as the dips shown as portions 90b, 92b, 94b, 96b of respective curves 90, 92, 94 and 96 in FIG. 3A. Therefore, as the frequencies of the predominant spectral components of the input audio signal rise, the frequency response of adaptive emphasis circuit 56 will slide past the curves 84, 86 and 88 to curves 90, 92, 94 and 96.

When the predominant signal components are concentrated in high frequencies such as around 5 kHz, high frequency noise around 5 kHz is masked. Noise at still higher frequencies may not be masked and it may be desirable to reduce such noise while also reducing low frequency noise in the manner described above. Thus the curves 90, 92, 94 and 96 at frequencies above the variable frequency retain the shape of a high frequency shelf. As shown in FIG. 3A, curves 84, 86, 88 tend towards the same fixed gain (e.g. 20 dB) at high frequencies. Even though not clearly shown in FIG. 3A, curves 90–96 also tend towards the same fixed gain at still higher frequencies. The complementary de-emphasis curves 84'–96' corresponding to respective pre-emphasis curves 84–96 are shown in FIG. 3B, and have variable frequencies 86a'–96a' which are substantially the same as those of the pre-emphasis curves. De-emphasis curves 90'–96' have peaks 90b'–96b' corresponding to dips 90b–96b of the pre-emphasis curves of FIG. 3A.

The overall effect of the curves 90–96 can now be described. Pre-emphasis curves with dips at the spectral regions of the predominant signal components will reduce the step-size and hence the broad-band noise emerging from the encoder-decoder system. The subsequent de-emphasis peaks 90b', 92b', 94b' and 96b' will pick out the wanted predominant signal components and restore them to their original amplitudes. The de-emphasis will also buck the signals at frequencies above the variable frequencies to reduce very high frequency noise. Thus the reduced low frequency noise level is retained, high frequency noise is masked and very high frequency noise is reduced.

In the above discussion, it has been assumed that the predominant signal components of the input audio are concentrated in a certain region of the frequency spectrum. Such an input signal is in fact the most critical case. When the signal spectral components are more distributed, their masking properties cover more of the noise, and the shapes of the pre-emphasis curves are less critical. If the signal spectral components are distributed in two regions of the frequency spectrum, the pre-emphasis curve will resemble the curve for the case where the spectral components are concentrated in a region between such two regions.

Bandwidth limitation circuits 24, 46, 54 and 80 limit the step-size and spectral control signals to within bandwidths of a few tens or low hundreds of Hz; hence the control signals can have rise times of a few milliseconds. The delay introduced by delay circuits 20, 58 is therefore chosen to be substantially equal to the rise times of the control signals as determined by the bandwidth limiting. Suitable values are in the range 5 to 20 milliseconds. The control A-D and D-A converters 26, 44, 72 and 76 may be simple delta or delta-sigma modulators and demodulators operating at a few kilobits per second. In television sound applications a convenient value is half the horizontal frequency, about 7.8 kHz.

Figure 4:
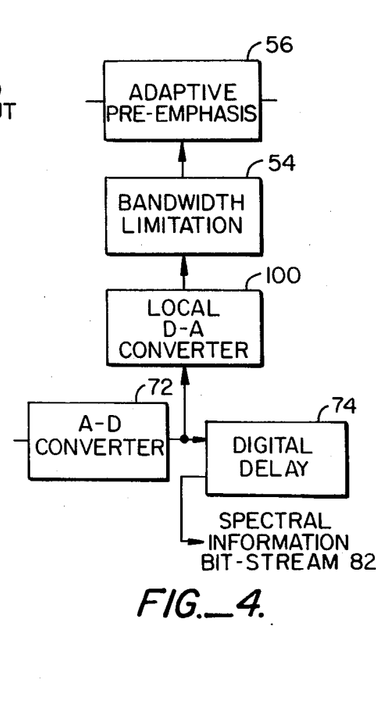
FIG. 4 is a block diagram illustrating the preferred embodiment for a portion of the pre-processing circuit of FIG. 2A.

For convenience in instrumentation and better tracking between encoder and decoder, the signal entering bandwidth limitation 54 in the encoder 10 may be derived from the information bit-stream 82 instead of the output of spectral analysis 52. Such configuration is illustrated in FIG. 4, with adaptive pre-emphasis 56, limitation circuit 54 and A-D converter 72 rearranged as shown. A local D-A converter 100 converts the digital step-size information from bit-stream 82 into an analog emphasis control signal. The circuit arrangement of FIG. 4 is particularly advantageous where the A-D converter 72 uses delta-sigma modulation so that the local D-A converter 100 is already contained within the A-D converter and no extra local D-A converter will be necessary. Similarly the step-size information supplied to adaptive delta-modulator circuit 22 may be derived from the step-size information bit-stream 28. This is again advantageous if A-D converter 26 uses delta-sigma modulation.

Instead of using a bandwidth limiting circuit 46 for limiting the bandwidth of step-size control signal applied to the adaptive delta-demodulator, D-A converter 44 may contain the bandwidth limitation. Similarly, bandwidth limitation circuit 80 may be eliminated if D-A converter 76 is similarly bandwidth limited.

Since it is desirable that the effect of a bit error should be a gain error or similar logarithmic magnitude for both large and small step-sizes, it is preferable to design the A-D converter 26 and D-A converter 44 so that the digital bit-stream 28 conveys the logarithm of the step-size. Similarly, the spectral information bit-stream preferably conveys the logarithm of the spectral information. In embodiments in which logarithmic and exponential circuits are inconvenient, it may be more practical to convey some other non-linear function of the step-size, such as the square root or the cube-root; such functions will not give perfectly uniform gain errors over the dynamic range of the system, but the extent of the variation will be much less than that resulting from a linear function.

For the same reasons discussed above for transmission of audio information, it is desirable to design an encoder-decoder system which conveys step-size information and spectral information at low bit rates of transmission and which can be implemented at low cost. In choosing the scheme for A-D and D-A conversion for converters 26, 44, 72 and 76 it is desirable to choose one that allows a low bit rate for the transmission of step-size information. Preferably, such bit rate is small compared to the bit rate for transmission of audio data. The A-D or D-A conversion performed in converters 26, 72 and 44, 76 can be one of many schemes, including PCM, delta modulation or delta-sigma modulation. While a PCM system requires a low bit rate, expensive converters must be used so that it is undesirable to use PCM in the converters. Delta-sigma modulation requires a somewhat higher bit rate (on the order of 5 to 10 kbit/sec) then PCM but it can be implemented simply and at low cost. Furthermore, the bit rate required for delta-sigma modulation is still low compared with the bit rate for the transmission of audio data (on the order of 200 to 300 kbit/sec). Therefore, delta-sigma modulation is used in the preferred embodiment discussed below. A description of delta-sigma modulation can be found in *Delta Modulation System*, Pentech Press Limited, London, 1975 by Raymond Steele.

Figures 1, 5:
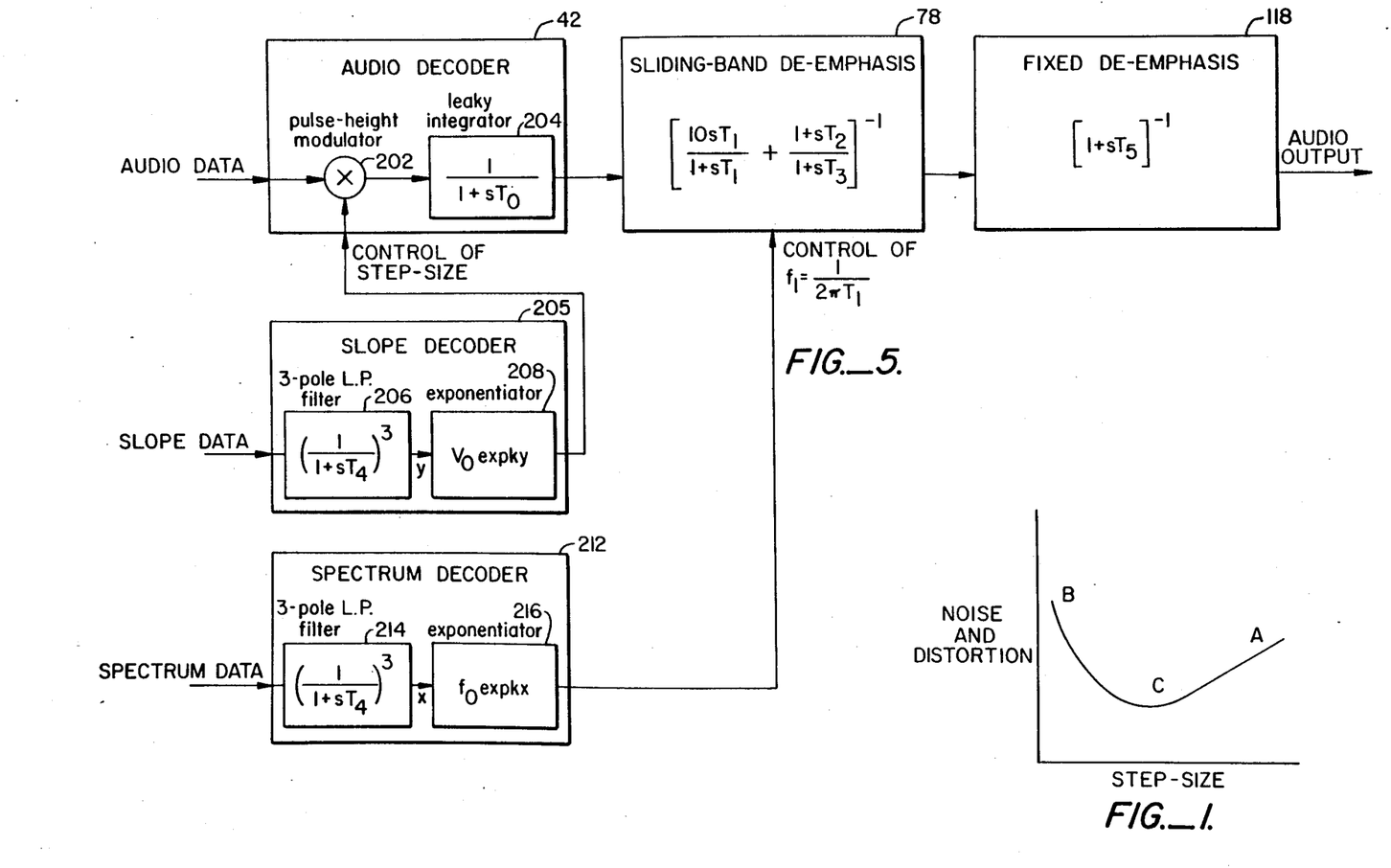
FIG. 1 is a graphical illustration of the noise and distortion emerging from an ADM coder-decoder as a function of the step-size applied by the coder-decoder.
FIG. 5 is a block diagram of a decoder which includes a post-processing circuit, the diagram containing the system definition of the decoder to illustrate the preferred embodiment of the invention.

FIG. 5 is a block diagram for a decoder system illustrating the preferred embodiment of the invention; the characteristics of most of the circuit blocks are defined for the system in FIG. 5. The system is particularly suitable for consumer use. The adaptive delta demodulator or audio decoder 42 comprises a pulse height modulator 202 and a leaky integrator 204. Pulse height modulator 202 multiplies the step-size control signal $V_{ss}$ by +1 or −1 in accordance with the audio data bit stream, and supplies the result to the leaky integrator 204. The leak time constant may be approximately 0.5 milliseconds which corresponds to a cutt-off frequency of approximately 300 Hz. The integrator integrates the resulting signal to produce an analog audio signal. At frequencies below the frequency corresponding to the leak time constant, the system is strictly not delta but delta-sigma modulation.

In reference to FIG. 2A, the adaptive delta modulator 22 also includes a leaky integrator (not shown) with a cut-off frequency which is about the same as the one in the decoder. The step-size derivation means 18 may be a slope detector which responds to the pre-processed input audio signal by deriving a control signal indicative of the slopes of the signal components of the audio input with frequencies above the cut-off frequency and the amplitudes of the signal components with frequencies below the cut-off frequency.

In the preferred embodiment, the step-size or slope data are transmitted by delta-sigma modulation and in the form of the logarithm of the required step-size or slope. The slope data are therefore decoded in the slope decoder 205 by passage through a low pass filter 206 (corresponding to D-A converter 44 and bandwidth limitation 46 of FIG. 2B), which determines the bandwidth (and hence the rise-time) and ripple of the slope voltage. In the preferred embodiment, a 3-pole low pass filter is employed which causes the step-size control signal Vss to have a rise time of about 10 milliseconds corresponding to a bandwidth of about 50 Hz. The slope voltage is then applied to an exponentiator 208 or anti-log. circuit, which may be, for example, a bipolar transistor. If the normalized mean level of the bit stream (or the duty-cycle measured over the rise-time of the low pass filter) is written as y, then $$V_{ss} = V_o \exp ky$$

where Vo and k are constants suitable for the particular implementation.

If a practical value of k is 10 ln 2, this definition gives an increase of 6 dB in step-size for every increase of 0.1 in y. Since y is confined to a range of 0 to 1, the resultant maximum possible range of Vss is 60 dB.

The transmission of slope information in logarithm form reduces the dynamic range conveyed in the slope data bit-stream from about 50 dB to about 19 dB, and spreads the effect of bit errors more uniformly across the dynamic range. Since Vss is confined by the low pass filter 206 to a bandwidth of about 50 Hz, bit errors lead to slow random amplitude modulation of the output audio. The audible disturbance produced by errors in the slope data bit-stream may be negligible. It has been observed that uncorrected bit error rates of up to 1 in 100 or so produce nearly imperceptible disturbance of music or speech.

The low pass filter thus converts the digital slope data into analog data and limits its bandwidth. Low pass filter 206 therefore performs both the functions of both the D-A converter 44 and bandwidth limitation 46 of FIG. 2B. In reference to FIGS. 2A, 2B and 5, delay means 20 introduces such delay that the slope data are received by filter 206 before the corresponding audio data are received by the pulse height modulator 202. Such time difference compensates for the rise time of about 10 milliseconds of Vss. In such manner, the need for a delay circuit in the decoder is eliminated.

FIG. 3B illustrates a set of de-emphasis curves which are complementary to those of the pre-emphasis curves of FIG. 3A. There are many ways to synthesize responses of this nature. The sliding band de-emphasis 78 defined in FIG. 5 shows one practical implementation of the de-emphasis characteristic. The system definitions for all the circuit blocks in FIG. 5 together with one set of values of the constants giving satisfactory results are listed below:

| | |
|---|---|
| leaky integrator 204 | $\dfrac{1}{1 + sT_o}$ |
| 3-pole L.P. filter 206,214 | $\left(\dfrac{1}{1 + sT_4}\right)^3$ |
| exponentiator 208 (slope decoder) | $V_o \exp ky$ |
| exponentiator 216 (spectrum data) | $f_o \exp kx$ |
| sliding band de-emphasis 78 | $\left[\dfrac{10sT_1}{1 + sT_1} + \dfrac{1 + sT_2}{1 + sT_3}\right]^{-1}$ |
| fixed de-emphasis 118 | $\dfrac{1}{1 + sT_5}$ | s is the complex frequency
$T_o = 0.5$ milliseconds
$T_1$ is variable so that the variable frequency of the sliding band de-emphasis $f_1$ is given by:

$$f_1 = 1/(2\pi T_1) = f_o \exp kx$$

$T_2 = 5$ microseconds
$T_3 = 50$ microseconds
$T_4 = 2$ milliseconds
$T_5 = 25$ microseconds
$f_o = 4$ kHz
$V_o$ is scaling factor to suit the design of the audio decoder.
x and y are the normalized mean levels of their respective bit-streams, i.e. the proportion of 1's measured over the smoothing time of the 3-pole L.P. filter.
$k = 10 \ln 2 = 6.93$ The spectrum decoder 212 comprising 3-pole filter 214 and exponentiator 216 is substantially the same as the slope decoder. It finds the normalized mean level x of the spectrum data input which conveys the logarithm of the variable frequency of the desired sliding band de-emphasis $f_1$ defined above, $f_1$ being different from the variable frequencies 86a–96a, 86a'–96a' of FIGS. 3A, 3B. The spectrum decoder generates the exponent of anti-log. of the mean level and applies the resulting voltage or current to the sliding band de-emphasis 78. The emphasis control signal is even less affected by bit errors in transmission than the slope data control signal.

In delta modulation systems the sampling frequency is vastly greater than the minimum required by information theory. Non-audio spectral components in the output are at frequencies well above the audio band and only an elementary low pass filter such as filter 118 is necessary.

Figure 6:
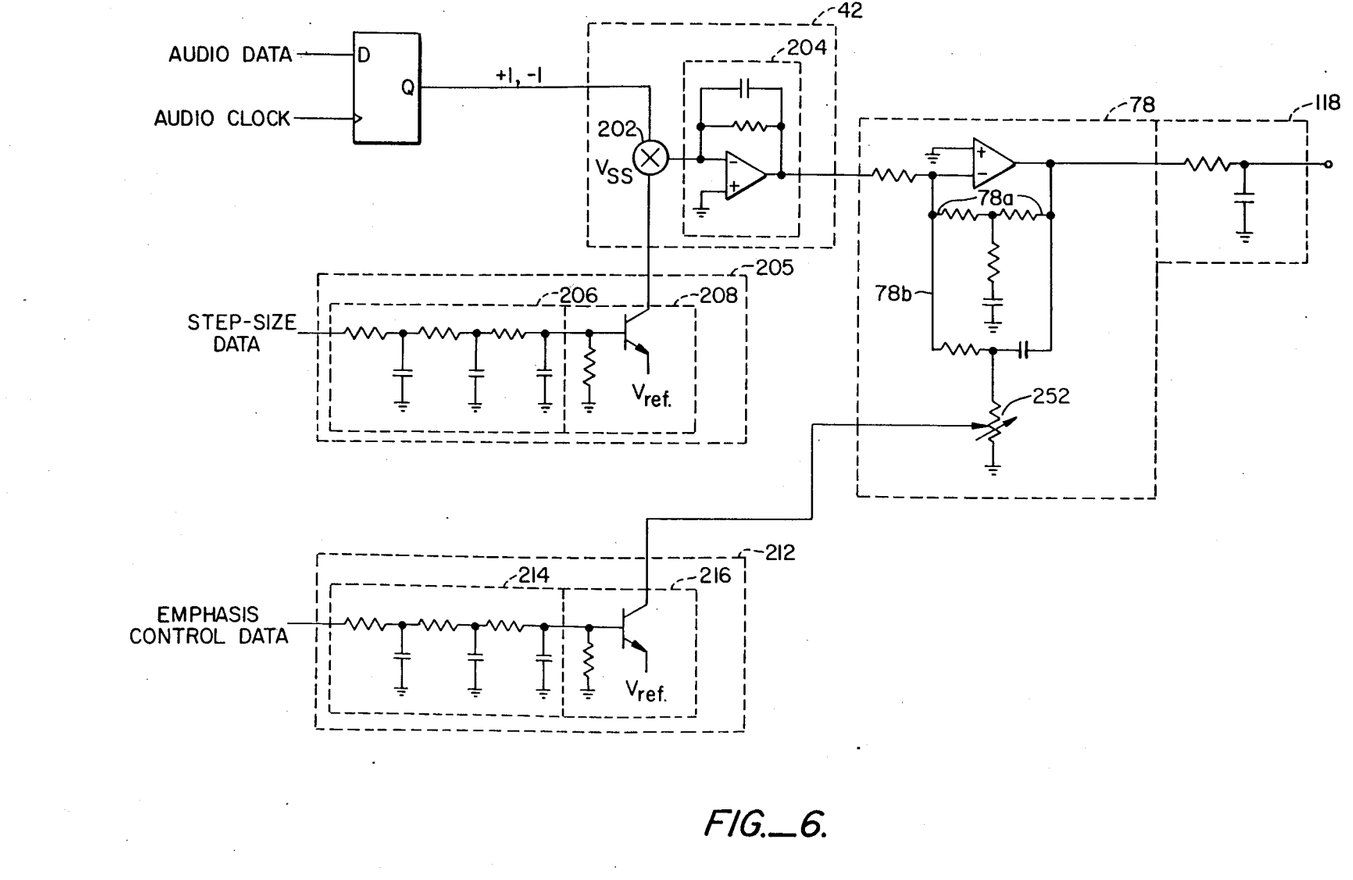
FIG. 6 is a schematic circuit diagram for the circuit of FIG. 5 to illustrate the invention.

FIG. 6 is a schematic circuit diagram showing a possible implementation of the system of FIG. 5. As shown in FIG. 6, the sliding band de-emphasis circuit 78 employs a main path 78a with fixed characteristics in parallel with a further path 78b with variable characteristics. The variable characteristics of the further path are controlled by the resistance of a variable resistance 252, which in turn is controlled by the emphasis control signal from spectrum decoder 212. There is no systematic compression or expansion of the dynamic range; the further path is controlled ultimately by the spectrum of the input audio.

In reference to FIG. 2B, by limiting the bandwidths of the step-size and emphasis control signals, the characteristics of the delta demodulator 42 and de-emphasis 78 can only change slowly. Because they have slowly changing characteristics, the delta demodulator and de-emphasis are thereby rendered linear or quasi-linear. It makes little difference whether the demodulation is performed ahead of the de-emphasis or vica versa. This linear or quasi-linear feature of the decoder system is even clearer in the case of the preferred embodiment in FIG. 5. Four processes are performed on the audio bit stream: pulse height modulation, leaky integration, sliding band de-emphasis and fixed de-emphasis. All four are linear or quasi-linear processes so that they can be performed in any order.

In FIG. 5, the pulse height modulator 202 can be a relatively simple circuit since it is required only to switch the sign of voltage Vss depending on the state of the audio bit-stream. Thus the modulator 202 may be made at low cost for consumer decoders. However, multiplying the audio data by the step-size control signal at a different point, say after sliding band de-emphasis but before fixed de-emphasis, may have the advantage that quality of the audio output is improved. This may be desirable for applications such as in broadcast stations and other professional equipment. While the multiplication will have to be performed by a circuit more complex and therefore costlier than the type of pulse height modulator adequate for the arrangement of FIG. 5, the improvement in quality for professional applications may be well worth the additional cost. Multiplying the audio data at a different point is permissible because the four processes are effectively linear as explained above. All such possible arrangements of the four processes are within the scope of this invention.

Instead of using a single 3-pole filter in the slope and spectrum decoders 205, 212, it is possible to use a two pole filter instead if an additional single pole filter is used to filter the output of exponentiators 208, 216. Thus the filtering can be split into two steps: one before the exponentiation and the other one after. Any arrangement of filters may be used as long as the filter for filtering the slope or spectrum data before the exponentiation restricts the ripple in the filter output to a few percent of its mean value.

This invention together with the invention of the companion application referenced above reduce the transmission bit rate of the audio bit-stream to that comparable with or somewhat less than the bit rate required for a companded PCM system with comparable performance. The transmission bit rates for the encoder-decoder system of this invention may be in the region of 200 or 300 kbit per second. The transmission of spectral and step-size information may require about 10 or 20 kbit per second and does not add significantly to the total transmission bit rate required for the encoder-decoder system of this invention. The encoder-decoder system of FIGS. 2A and 2B, however, retains the advantages of delta modulation systems. The invention reduces and in many applications eliminates disturbing effects of bit errors. It and its components have high tolerance of errors. The receiving equipment (decoder) is inexpensive. The system is efficient in usage of channel capacity so that more excess capacity will exist for flexibility to add additional channels or more bandwidth will be available to other signals such as video signals. The transmission equipment (encoder) does not require special attention or require the use of non-complementary signal processing.

It will be apparent to those skilled in the art that the principles described herein are applicable not only to adaptive delta-modulation, but to other adaptive A-D and D-A coding systems, such as delta-sigma modulation, double intergration delta-modulation, and PCM systems with variable reference voltages.

While the invention has been described for the processing and transmission of audio signals, it will be understood that it may be used for the processing and transmission of other signals as well. The above description of circuit implementation and method is merely illustrative thereof and various changes in arrangements or other details of the method and implementation may be within the scope of the appended claims.

We claim:

1. A circuit for pre-processing a signal before the signal is subjected to a medium which introduces noise, said circuit altering the spectral composition of the signal before it is subjected to the medium to reduce the noise subsequently introduced, said circuit comprising:
    means for analyzing the spectral composition of said signal, and for generating a control signal indicative of the regions in a frequency spectrum, if any, where the predominant signal components of the signal are concentrated, wherein said analyzing means includes a bandwidth limitation circuit for limiting the bandwidth of the control signal;
    means responsive to said control signal for altering the spectral composition of said signal by amplifying or attenuating the spectral components of said signal by different amounts as a function of the control signal; and
    means for introducing delay to said signal before reaching said spectral composition altering means to compensate for the bandwidth limitation, wherein the noise subsequently introduced by the medium is reduced.

2. The circuit of claim 1, wherein said delay introduced also compensates for the time required for deriving the control signal.

3. A circuit for pre-processing a signal to prepare it for a medium whose noise level rises with the signal level, said circuit comprising:
    means for analyzing the spectrum of the signal and for generating a control signal indicative of the regions in a frequency spectrum, if any, where the predominant components of the signal are concentrated; and
    means responsive to said control signal for applying emphasis to the spectral components of the signal, so that when the predominant signal components are concentrated within a first frequency range, at least some of the spectral components with frequencies above those of the predominant spectral components are boosted, and the predominant spectral components remain substantially unchanged and when the predominant signal components are concentrated within a second frequency range with frequencies above those of the first range, spectral components with frequencies above those of the predominant signal components are boosted but the predominant signal components are bucked, so that when the predominant signal components are concentrated in the second frequency range, the rise in noise level caused by the medium is reduced.

4. The circuit of claim 3, wherein the second frequency range has an upper end and a lower end, and wherein the emphasis applying means is such that:
(a) when the predominant spectral components are detected to be concentrated below a first predetermined frequency in the first frequency range, spectral components above the first predetermined frequency are boosted;
(b) when the predominant spectral components are detected to be concentrated below a second predetermined frequency but above the first predetermined frequency, spectral components with frequencies above those of the predominant spectral components are boosted, said second predetermined frequency being substantially at the lower end of the second frequency range; and
(c) when the predominant spectral components are detected to be concentrated above the second predetermined frequency, spectral components with frequencies above those of the predominant spectral components are boosted, the predominant spectral components are bucked and spectral components with frequencies below those of the predominant spectral components remain substantially unchanged.

5. The circuit of claims 3 or 4, further comprising means for limiting the bandwidth of the control signal before application to the emphasis applying means.

6. The circuit of claim 5, further comprising means for introducing delay to said signal so that when the delayed signal reaches the emphasis applying means, the control signal, after being limited in bandwidth, is available for controlling the emphasis applied to the spectral components of the signal.

7. The circuit of claim 4, wherein said first predetermined frequency is approximately 500 Hz.

8. The circuit of claim 4, wherein the emphasis applying means is such that when the predominant spectral components are detected to be concentrated below the first predetermined frequency, the spectral components below the first predetermined frequency remain substantially unchanged, and such that when the predominant spectral components are detected to be concentrated below the second predetermined frequency but above the first predetermined frequency, the predominant spectral components and spectral components with frequencies below those of the predominant spectral components remain substantially unchanged.

9. The circuit of claim 4, wherein the second predetermined frequency is approximately 2 kHz.

10. The circuit of claims 1 or 3, wherein the input signal is applied directly to the analyzing means for analysis of its spectrum and detection of its predominant spectral components.

11. The circuit of claim 1, wherein said noise introduced by the medium increases with the signal level.

12. The circuit of claims 3, 4 or 11, wherein said medium includes an analog to digital conversion, and wherein said noise is quantizing noise introduced by the conversion.

13. A circuit for altering the spectral composition of a signal for use in a system, said system including a circuit for restoring the spectral composition of spectrally altered signals received through a medium, said restoring circuit also receiving through the medium spectral information related to the spectrally altered signals received, said restoring circuit including means for bandwidth limiting the spectral information and means for applying de-emphasis to the received spectrally altered signals in response to the bandwidth limited spectral information related to such signals to restore the spectral compositions of such signals, said altering circuit comprising:
means for analyzing the spectral composition of a signal, and for generating a control signal indicative of the spectral composition of said signal;
means responsive to said control signal for altering the spectral composition of said signal by applying emphasis to the spectral components of said signal by different amounts as a function of the control signal to provide a spectrally altered signal; and
means for introducing delay to said signal before reaching said spectral composition altering means, said time delay being such that the control signal is available to the medium by a predetermined and substantially fixed time interval before the spectrally altered signal is available to the medium;
wherein said substantially fixed time interval compensates for the rise time of the bandwidth limiting means so that the bandwidth limited spectral information is available to the de-emphasis applying means when the spectrally altered signal related to such information arrives at the de-emphasis means in the restoring circuit, and wherein the effects of errors introduced by the medium are reduced.

14. A circuit for restoring the spectral composition of signals by applying variable de-emphasis, said circuit receiving through a medium a signal whose spectral composition has been altered by the application of emphasis to its spectral components by different amounts as a function of the spectral composition of the signal and in response to an emphasis control signal before it is subjected to the medium, said emphasis control signal indicating regions in a frequency spectrum, if any, where the predominant components of the signal are concentrated, said medium having a noise level which rises with the signal level, said circuit also receiving through the medium spectral information of the signal, wherein said spectral information received is distinguishable from the corresponding signal, said circuit comprising:
means responsive to said spectral information for generating a de-emphasis control signal; and
means responsive to said de-emphasis control signal for applying de-emphasis to the spectral components so that, when the predominant signal components are concentrated within a first frequency range, at least some of the spectral components with frequencies above those of the predominant spectral components are bucked, and the predominant spectral components remain substantially unchanged and when the predominant signal components are concentrated within a second frequency range with frequencies above those of the first range, spectral components with frequencies above those of the predominant signal components are bucked but the predominant signal components are boosted, so that when the predominant signal components are concentrated in the second frequency range, the rise in noise level caused by the medium is reduced.

15. The circuit of claim 14, wherein the second frequency range has an upper end and a lower end, and wherein the de-emphasis applying means is such that:
(a) when the predominant spectral components are detected to be concentrated below a first predetermined frequency in the first frequency range, spectral components above the first predetermined frequency are bucked;

(b) when the predominant spectral components are detected to be concentrated below a second predetermined frequency but above the first predetermined frequency, spectral components with frequencies above those of the predominant spectral components are bucked, the second predetermined frequency being substantially at the lower end of the second frequency range; and (c) when the predominant spectral components are detected to be concentrated above the second predetermined frequency, spectral components with frequencies above those of the predominant spectral components are bucked, the predominant spectral components are boosted and spectral components with frequencies below those of the predominant spectral components remain substantially unchanged.

16. The circuit of claim 15 wherein the de-emphasis control signal generated indicates the normalized mean level x of the spectral information and wherein the de-emphasis applied is defined by the relationship:

$$\text{gain} = \left[ \frac{10sT_1}{1 + sT_1} + \frac{1 + sT_2}{1 + sT_3} \right]^{-1}$$

where s is the complex frequency $T_1 = f_o/(2\pi \exp kx)$ $T_2$ is about 5 microseconds $T_3$ is about 50 microseconds, and $f_o$ is about 4 kHz.

17. A circuit for restoring the spectral composition of a signal received from a medium whose noise level varies with the signal level, said circuit receiving through the medium the signal whose spectral composition has been altered by the application of emphasis to its spectral components by different amounts as a function of spectral information indicative of regions in a frequency spectrum, if any, where the predominant signal components of the signal are concentrated, said circuit also receiving through the medium the spectral information, wherein the spectral information received is distinguishable from the signal, said circuit comprising:

means responsive to said spectral information for generating a de-emphasis control signal, said generating means including a bandwidth limitation circuit for limiting the bandwidth of the de-emphasis control signal; and means responsive to the bandwidth limited de-emphasis control signal for restoring said spectral composition by applying de-emphasis to the spectral components of the altered signal, and wherein the effects of errors introduced by the medium are reduced.

18. The circuit of claim 14, 15 or 17, wherein said spectral information is received by the circuit in advance of the altered input signal by a predetermined and substantially fixed time interval.

19. The circuit of claim 18, wherein the time interval has such magnitude that said signal and said bandwidth limited de-emphasis control signal have a timing relationship substantially the same as that between the unaltered signal and the emphasis control signal so that the de-emphasis applied is substantially complementary to the emphasis.

20. The circuit of claim 15, wherein the de-emphasis applying means is such that when the predominant spectral components are detected to be concentrated below the first predetermined frequency, the spectral components below the first predetermined frequency remain substantially unchanged, and such that when the predominant spectral components are detected to be concentrated below the second predetermined frequency but above the first predetermined frequency, the predominant spectral components and spectral components with frequencies below those of the predominant spectral components remain substantially unchanged.

21. A circuit for restoring the spectral composition of a signal, said spectral composition having been altered as a function of an emphasis control signal, said emphasis control signal indicating regions in a frequency spectrum where the predominant components of the signal, if any, are concentrated, said circuit receiving the altered signal and spectral information of the signal through a medium, wherein said spectral information is received by the circuit in advance of the altered signal by a predetermined and substantially fixed time interval, wherein said information is distinguishable from said altered signal, said circuit comprising:

means responsive to said spectral information for generating a de-emphasis control signal, said generating means including means for limiting the bandwidth of the de-emphasis control signal; and means responsive to the bandwidth limited de-emphasis control signal for restoring said spectral composition by applying de-emphasis to the spectral components of the altered signal;

wherein said substantially fixed time interval compensates for the rise time of the bandwidth limitation so that the bandwidth limited de-emphasis control signal is available to the de-emphasis applying means when the spectrally altered signal related to such de-emphasis control signal arrives at the de-emphasis applying means, and wherein the effects of errors introduced by the medium are reduced.

22. The circuit of claim 21, wherein the time interval has such magnitude that said signal and said bandwidth limited de-emphasis control signal have a timing relationship substantially the same as that between the unaltered signal and said emphasis control signal so that the de-emphasis applied is substantially complementary to the emphasis.

23. The circuit of claim 15, wherein said means for generating the de-emphasis control signal also limits the bandwidth of the de-emphasis control signal to reduce the effects of errors introduced by the medium.

24. The circuit of claim 17, 21 or 23, wherein said de-emphasis control signal generating means includes a low pass filter for limiting the bandwidth of the de-emphasis control signal.

25. The circuit of claim 24, wherein said spectral information is transmitted to the circuit in the form of digital signals converted from analog signals by delta-sigma modulation and wherein said low pass filter also decodes the digital spectral information to provide an analog de-emphasis control signal.

26. The circuit of claim 24, wherein said low pass filter has a transfer characteristic of the form $(1+sT)^{-3}$, where s is the complex frequency and T is about 2 milliseconds.

27. The circuit of claim 26, wherein the spectral composition of the signal has been altered in accordance with an emphasis control signal indicative of the spectral content of the signal, wherein the spectral information is in the form of the logarithm of said emphasis control signal, said circuit further comprising an exponentiator for generating the de-emphasis control signal from the spectral information.

28. The circuit of claim 27, wherein said low pass filter comprises a single pole filter for filtering the output of said exponentiator and a two pole filter for filtering the spectral information and for applying the filtered spectral information to the exponentiator for generating the de-emphasis control signal.

29. The circuit of claim 27, wherein said low pass filter comprises a filter for filtering the spectral information, said filter having such a response that it restricts the ripple in its output to a few percent of its mean level, said filter applying its output to the exponentiator.

30. The circuit of claims 14, 15, 17 or 21, wherein said de-emphasis control signal is substantially equal to the emphasis control signal so that the de-emphasis applied is substantially complementary to the emphasis.

31. The circuit of claims 17, 21 or 22, wherein said medium introduces noise which increases with the level of the signal and wherein the restoration of the spectral composition of the signal reduces such noise.

32. The circuit of claim 31, wherein said medium includes an analog to digital conversion and wherein said noise introduced by the medium is quantizing noise introduced by the conversion.

33. The circuit of claims 14, 15 or 16, wherein said medium includes an analog to digital conversion and wherein said noise introduced by the medium is quantizing noise introduced by the conversion.

34. The circuit of claim 1, wherein the medium introduces noise whose level rises with the signal level, wherein said analyzing means detects the predominant spectral components, if any, of the signal and wherein said spectral composition altering means applies emphasis to the different spectral components of the signal so that spectral components with frequencies above those of the predominant spectral components are boosted, the predominant spectral components are bucked or remain substantially unchanged and spectral components with frequencies below those of the predominant spectral components remain substantially unchanged, so that the rise in noise level caused by the medium is reduced.

35. The circuit of claim 1, wherein the delay introduced is approximately in the range 5 to 20 milliseconds.

36. A system for pre-processing a signal to prepare it for a medium which introduces noise and for post-processing the signal after it has been subjected to the medium, said system comprising:

(a) a pre-processing circuit which alters the spectral composition of a signal comprising:
  means for analyzing the spectral composition of said signal, and for generating an emphasis control signal indicative of the regions in a frequency spectrum, if any, where the predominant components of the signal are concentrated, wherein said analyzing means includes a circuit for limiting the bandwidth of the emphasis control signal;
  means responsive to said emphasis control signal for altering the spectral composition of said signal by applying emphasis to the spectral components of said signal by different amounts as a function of the emphasis control signal to prepare it for the medium; and
  means for introducing delay to said signal before reaching said spectral composition altering means to compensate for the time required for limiting the bandwidth of the emphasis control signal; and (b) a post-processing circuit for restoring the spectral composition of the signal, said circuit receiving the signal after it has been subjected to the medium, said post-processing circuit also receiving through the medium the emphasis control signal or a signal derived from said emphasis control signal, said post-processing circuit comprising:
  means responsive to said emphasis control signal or the signal derived therefrom for generating a de-emphasis control signal, said de-emphasis control signal generating means including a circuit for limiting the bandwidth of the de-emphasis control signal; and
  means responsive to the de-emphasis control signal for restoring said spectral composition by applying de-emphasis to the spectral components of the altered signal, so that the noise introduced by the medium is reduced.

37. The system of claim 36, wherein the delay introduced by the delay introducing means delays the signal such that the emphasis control signal or the signal derived therefrom reaches the post-processing circuit a predetermined time period before the pre-processed signal reaches the post-processing circuit, said time period selected to compensate for the time required for limiting the bandwidth of the de-emphasis control signal, so that the de-emphasis control signal is available to the de-emphasis applying means when the pre-processed signal reaches the de-emphasis applying means.

38. A system for pre-processing a signal to prepare it for a medium whose noise level rises with the signal level, and for post-processing the signal after it has been subjected to the medium, said system comprising:

(a) a pre-processing circuit which alters the spectral composition of the signal to prepare it for the medium, said pre-processing circuit comprising:
  means for analyzing the spectrum of the signal and for generating an emphasis control signal indicative of regions in a frequency spectrum where the predominant components of the signal are concentrated; and
  means responsive to said emphasis control signal for applying emphasis to the spectral components of the signal, so that when the predominant signal components are concentrated in a first frequency range, at least some of the spectral components with frequencies above those of the predominant spectral components are boosted, the predominant spectral components remain substantially unchanged and when the predominant signal components are concentrated in a second frequency range with frequencies above those of the first range, spectral components with frequencies above those of the predominant spectral components are boosted but the predominant signal components are bucked; and (b) a circuit for post-processing the signal after it has been subjected to the medium to restore its spectral composition by applying variable de-emphasis, said circuit receiving through the medium the emphasis control signal or a signal derived therefrom, said post-processing circuit comprising:

means responsive to said emphasis control signal or the signal derived therefrom for generating a de-emphasis control signal; and means responsive to said de-emphasis control signal for applying de-emphasis to the spectral components so that when the predominant signal components are concentrated in the first range, at least some of the spectral components with frequencies above those of the predominant spectral components are bucked, and the predominant spectral components remain substantially unchanged and when the predominant signal components are concentrated in the second range, spectral components with frequencies above those of the predominant spectral components are bucked but the predominant signal components are boosted, so that noise introduced by the medium is reduced.

39. The system of claims 36 or 38, wherein said de-emphasis applied by the post-processing circuit is substantially complementary to the emphasis applied by the pre-processing circuit so that the original spectral composition of the signal is substantially restored by the system.

40. The circuit of claim 1, wherein said medium includes an analog to digital encoding process by an encoder for encoding the spectrally altered signal into a first digital bit stream and a subsequent digital to analog decoding process by a decoder for decoding the bit stream into an analog signal, said circuit further comprising a second A-D converter for converting said control signal into a second digital spectral control bit stream.

41. The circuit of claim 40, wherein the second A-D converter includes a D-A converter which converts said second digital spectral control bit stream into an analog spectral control signal, and wherein said spectral composition altering means is responsive to said spectrum control signal in analog form derived from the second digital spectral control bit stream.

42. The circuit of claim 15, wherein said first predetermined frequency is approximately 500 Hz.

43. The circuit of claim 15, wherein said second predetermined frequency is approximately 2 kHz.

* * * * *

UNITED STATES PATENT AND TRADEMARK OFFICE
CERTIFICATE OF CORRECTION

PATENT NO.　: 　4,700,361
DATED　　　: 　Oct. 13, 1987
INVENTOR(S): 　Todd et al.

It is certified that error appears in the above-identified patent and that said Letters Patent is hereby corrected as shown below:

Col. 14, line 65: "bucked,so" should be --bucked, so--;

Col. 17, line 60: "claim" should be --claims--; and

Col. 22, lines 19-20: "spectrum" should be --spectral--.

Signed and Sealed this

Eighth Day of March, 1988

Attest:

DONALD J. QUIGG

Attesting Officer　　　Commissioner of Patents and Trademarks